(12) United States Patent
Norling et al.

(10) Patent No.: US 10,461,737 B2
(45) Date of Patent: Oct. 29, 2019

(54) CONFIGURABLE CLAMP CIRCUIT

(71) Applicant: Infineon Technologies Austria AG, Villach (AT)

(72) Inventors: Karl Norling, Villach (AT); Erwin Huber, Munich (DE)

(73) Assignee: Infineon Technologies Austria AG, Villach (AT)

(*) Notice: Subject to any disclaimer, the term of this patent is extended or adjusted under 35 U.S.C. 154(b) by 14 days.

(21) Appl. No.: 15/332,873

(22) Filed: Oct. 24, 2016

(65) Prior Publication Data

US 2018/0115311 A1    Apr. 26, 2018

(51) Int. Cl.
*H03K 17/16* (2006.01)
*G05F 3/02* (2006.01)
*H03K 5/08* (2006.01)
*H03K 17/687* (2006.01)
*H03K 17/06* (2006.01)

(52) U.S. Cl.
CPC .............. *H03K 17/168* (2013.01); *G05F 3/02* (2013.01); *H03K 5/08* (2013.01); *H03K 17/06* (2013.01); *H03K 17/6872* (2013.01); *H03K 2017/066* (2013.01)

(58) Field of Classification Search
CPC .. H03K 17/168; H03K 17/06; H03K 17/6872; H03K 5/08; G05F 3/02
USPC .................................................. 327/109, 112
See application file for complete search history.

(56) References Cited

U.S. PATENT DOCUMENTS

| 6,762,646 B1* | 7/2004 | Bell ..................... H03F 3/45192 330/257 |
| 7,236,011 B2* | 6/2007 | Tam .................. H03K 19/01707 326/83 |
| 9,444,446 B2* | 9/2016 | Fukuta .................. H03K 17/168 |
| 2004/0129996 A1* | 7/2004 | Shin ........................ G09G 3/296 257/500 |
| 2012/0025875 A1* | 2/2012 | Fukuta ..................... H02M 1/08 327/109 |
| 2012/0075753 A1* | 3/2012 | Watanabe ............. B60L 15/007 361/18 |

(Continued)

FOREIGN PATENT DOCUMENTS

| JP | H07321621 A | 12/1995 |
| JP | 2006320087 A | 11/2006 |

(Continued)

*Primary Examiner* — Ryan Jager
(74) *Attorney, Agent, or Firm* — Slater Matsil, LLP

(57) ABSTRACT

In accordance with an embodiment of the present invention, a circuit includes a configurable clamp driver circuit for clamping a voltage at a gate terminal of a transistor below a turn-on voltage threshold upon switch-off of the transistor. In a first clamp driver circuit mode, an output terminal of the clamp driver circuit is configured to be coupled to the gate terminal of the transistor to provide a first discharge path from the gate terminal of the transistor upon switch-off of the transistor. In a second clamp driver circuit mode, the output terminal of the clamp driver circuit is configured to be coupled to an input terminal of a clamp circuit, wherein the clamp circuit is coupled to the gate terminal of the transistor to provide a second discharge path from the gate terminal of the transistor upon switch-off of the transistor.

19 Claims, 7 Drawing Sheets

(56) References Cited

U.S. PATENT DOCUMENTS

| | | | |
|---|---|---|---|
| 2012/0086496 A1* | 4/2012 | Itou | H03K 17/06 327/398 |
| 2015/0171852 A1* | 6/2015 | Pang | H03K 17/08104 327/109 |
| 2015/0214732 A1* | 7/2015 | Haruki | H02H 9/046 361/56 |
| 2017/0302151 A1* | 10/2017 | Snook | H02M 1/08 |

FOREIGN PATENT DOCUMENTS

| | | |
|---|---|---|
| JP | 2009194514 A | 8/2009 |
| JP | 2012016110 A | 1/2012 |
| JP | 2013207619 A | 10/2013 |
| JP | 2015005866 A | 1/2015 |
| WO | 2012157301 A | 11/2012 |

\* cited by examiner

FIGURE 3A

CONFIGURABLE CLAMP CIRCUIT

TECHNICAL FIELD

The present invention relates generally to the field of semiconductor electronics and, in particular embodiments, to the technical field of clamping circuits.

BACKGROUND

Gate driver circuits are pervasive in many electronic applications from computers to automobiles to solar power generation. A gate driver circuit may be used to implement a portion of a switched-mode circuit, including, for example, a switched-mode power supply or another switched-mode circuit. In many cases, voltages within a switched-mode circuit system are generated by performing a DC-DC, DC-AC, and/or AC-DC conversion by operating a gate driver circuit coupled to a switch. The switch can itself be coupled to an inductor, transformer, motor, etc. Switched-mode circuits may also be implemented using a gate driver circuit to drive the gates of one or more switching transistors, such as IGBT or MOSFET power devices. However, parasitic turn-on or re-turn-on of the driven switch transistor may be an undesired phenomenon in many situations for gate driver circuits. Parasitic turn-on is a physical effect that may be due to a fast voltage change across the driven switch transistor combined with a parasitic gate-to-collector capacitance or gate-to-drain capacitance of the switch transistor, this parasitic capacitance also known as Miller capacitance. For example, the fast voltage change may generate a parasitic current across a parasitic Miller capacitance of the switch transistor that, in turn, generates a parasitic voltage at the gate of the switch transistor. If the voltage raises the gate above the threshold voltage of the switch transistor, the switch transistor may be turned on even when the switch transistor is configured to be turned off. This parasitic turn-on may generate excess current and may affect the efficiency and operation of the circuit. In some cases, a clamping circuit may be implemented within the gate driver circuit to reduce or eliminate effects due to parasitic turn-on.

SUMMARY

In accordance with an embodiment of the present invention, a circuit includes a configurable clamp driver circuit for clamping a voltage at a gate terminal of a first transistor below a turn-on voltage threshold upon switch-off of the first transistor, wherein the clamp driver circuit is configured to be operated in one of two modes. In a first mode of the two modes, an output terminal of the clamp driver circuit is configured to be coupled to the gate terminal of the first transistor to provide a first discharge path for a current flowing from the gate terminal of the first transistor upon switch-off of the first transistor, the first discharge path bypassing a resistance coupled to the gate terminal of the first transistor. In a second mode of the two modes, the output terminal of the clamp driver circuit is configured to be coupled to an input terminal of a clamp circuit, wherein the clamp circuit is coupled to the gate terminal of the first transistor to provide a second discharge path for the current flowing from the gate terminal of the first transistor upon switch-off of the first transistor, the second discharge path bypassing the resistance coupled to the gate terminal of the first transistor.

In accordance with another embodiment of the present invention, an integrated circuit includes a clamp driver circuit including a pull-up circuit and a pull-down circuit, the pull-up circuit and the pull-down circuit coupled to a gate-driver output terminal, wherein the gate-driver output terminal is configured to be coupled to an input terminal of a power transistor. The integrated circuit also includes a logic circuit coupled to the pull-up circuit and the pull-down circuit, wherein the logic circuit is configured to control the pull-up circuit and the pull-down circuit. The clamp driver circuit is configured to be coupled in either a first configuration or a second configuration, wherein in the first configuration, an output terminal of the clamp driver circuit is configured to be coupled to the gate terminal of the power transistor, and in the second configuration, the output terminal of the clamp driver circuit is configured to be coupled to a gate terminal of an external clamp transistor, wherein an output terminal of the external clamp transistor is coupled to the gate terminal of the power transistor.

In accordance with another embodiment of the present invention, a method includes configuring a clamp driver circuit in one of two configurations, wherein configuring the clamp driver circuit in a first configuration includes coupling an output terminal of the clamp driver circuit to a gate terminal of a first transistor, and configuring the clamp driver circuit in a second configuration includes coupling the output terminal of the clamp driver circuit to a gate terminal of a clamp transistor, wherein an output terminal of the clamp transistor is coupled to the gate terminal of the first transistor. The method also includes switching off the first transistor and activating the clamp driver circuit.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3B illustrate embodiments of a gate-driver circuit having a configurable clamp with a voltage regulation subcircuit.

DETAILED DESCRIPTION OF ILLUSTRATIVE EMBODIMENTS

Figure 1:
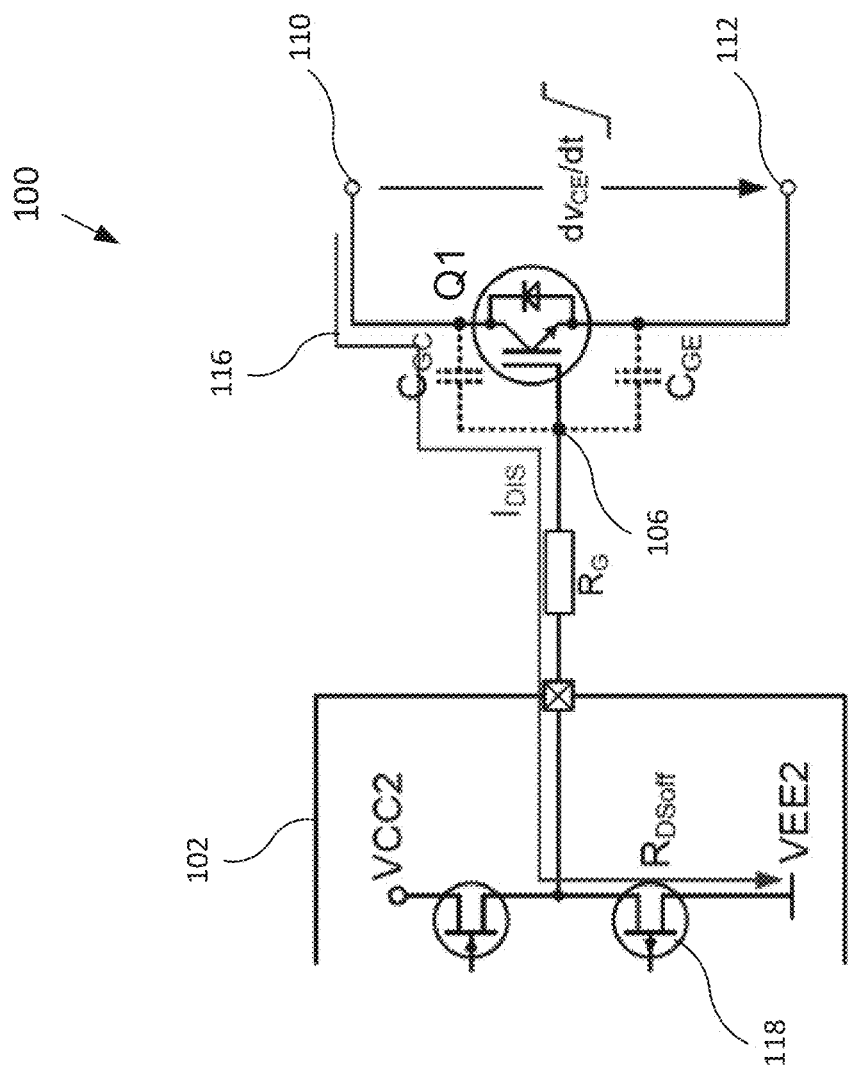
FIG. 1 is a schematic of a gate-driver circuit coupled to a switching transistor.

Before embodiments of the present invention will be explained in greater detail in the following taking reference to the figures, it is to be pointed out that the same or functionally equal elements are provided with the same reference numerals in the figures, and that a repeated description of these elements shall be omitted. Hence, the description of the elements provided with the same reference numerals is mutually interchangeable and/or applicable in the various embodiments.

In an embodiment, a configurable clamp driver may be configured to be either an integrated open drain clamp or a gate driver driving an external discrete clamp transistor. The configurable clamp driver may be configurable, for example, by programmable logic, fusing or metal change. In this manner, a single clamp driver may be used as an external clamp driver or as the clamp itself. The configurable clamp driver may be coupled, for example, to a switch transistor, power device, or other switching circuit.

FIG. 1 shows a schematic of an example gate-driver circuit 100 undergoing parasitic turn-on. The example switched-mode circuit 100 includes a switched-mode driver 102 coupled to and configured to drive an output stage including a power device Q1. The power device Q1 is shown as an IGBT, though in other cases Q1 may be another type of power device such as a power MOSFET, silicon carbide MOSFET, JFET, HEMT, the like, or a combination of power devices. The gate terminal 106 of Q1 is coupled to the switched-mode driver 102 through gate resistor $R_G$. An example collector node no is shown coupled to the collector of Q1 and an example emitter node 112 is shown coupled to the emitter of Q1. Also shown in FIG. 1 is a parasitic Miller capacitance $C_{GC}$ between the collector node no and the gate 106 of Q1. In some cases, Q1 may be paired with an additional power device (not shown) as part of a half-bridge topology. For example, the additional power device may be coupled to the collector node 110. In some cases, Q1 may be coupled to the driver 102 through an external booster (not shown).

In some cases, turning on a paired device (e.g., the additional power device coupled to Q1 described above) may cause a rapid voltage change between the collector node no and emitter node 112 of Q1. For example, this voltage may be triggered by turning on the additional paired device in a half-bridge topology and having load current flow through a freewheeling diode of Q1 before the paired device is fully turned on. This high $dv_{CE}/dt$ across Q1 may generate a current $I_{DIS}$ through the parasitic Miller capacitor $C_{GC}$. The current $I_{DIS}$ may then generate a voltage drop across $R_G$ that raises the voltage on the gate 106. In this illustrative example, the current $I_{DIS}$ flows to VEE2 through the pull-down device 118 of the driver 102, which has a resistance of $R_{DSoff}$. The voltage $V_G$ generated on the gate terminal 106 relative to the emitter node 112 may be calculated according to equations (1) and (2) below:

$$I_{DIS} = C_{GC} * dv_{CE}/dt \quad (1)$$

$$V_G = V_{VEE2} + I_{DIS} * (R_G + R_{DSoff}). \quad (2)$$

When $V_G$ is higher than the threshold voltage of the power device Q1, Q1 is then turned on parasitically. This dynamic turn-on of Q1 lasts until the regular discharge path through $R_G$ compensates for the increased gate voltage $V_G$. In some cases, inductance of the connections between the driver 102 and Q1 can increase a parasitic turn-on effect. For example, an increased connection inductance can correspondingly increase the high-frequency impedance seen from the gate of Q1 toward the driver 102. A high-frequency current $I_{DIS}$ across this increased high-frequency impedance also increases the voltage $V_G$ generated on the gate terminal 106 that can turn on Q1 parasitically. In some cases, the inductance of the connections between the driver 102 and Q1 increases the time it takes the discharging current to lower $V_G$ below threshold. The parasitic turn-on may affect the safety and efficiency of the system. For example, in some cases current shoot-through between Q1 and a paired device could occur, which may reduce efficiency and even damage the device itself.

Figure 2A:
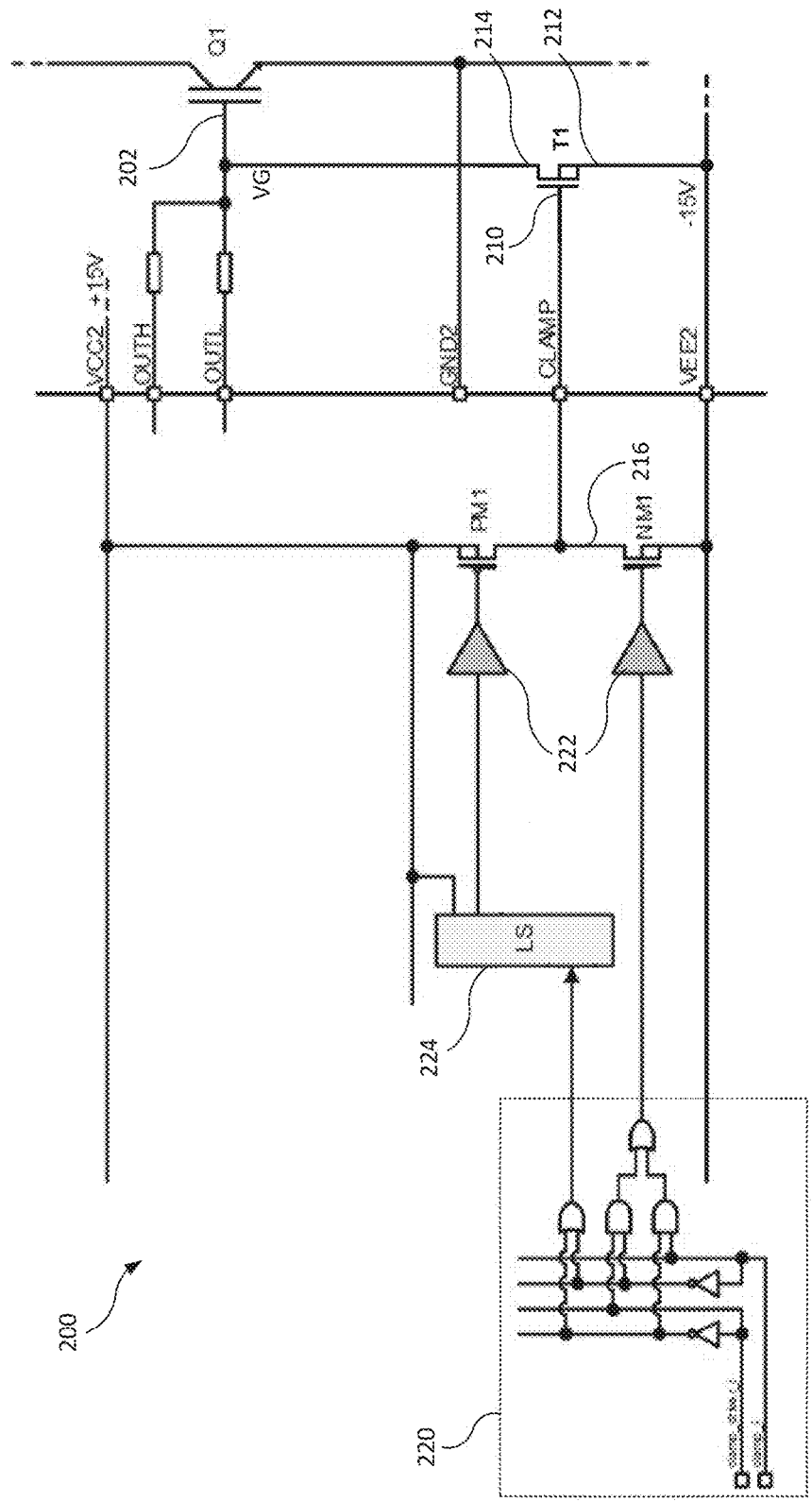
FIGS. 2A-2B illustrate embodiments of a gate-driver circuit having a configurable clamp.
Figure 2B:
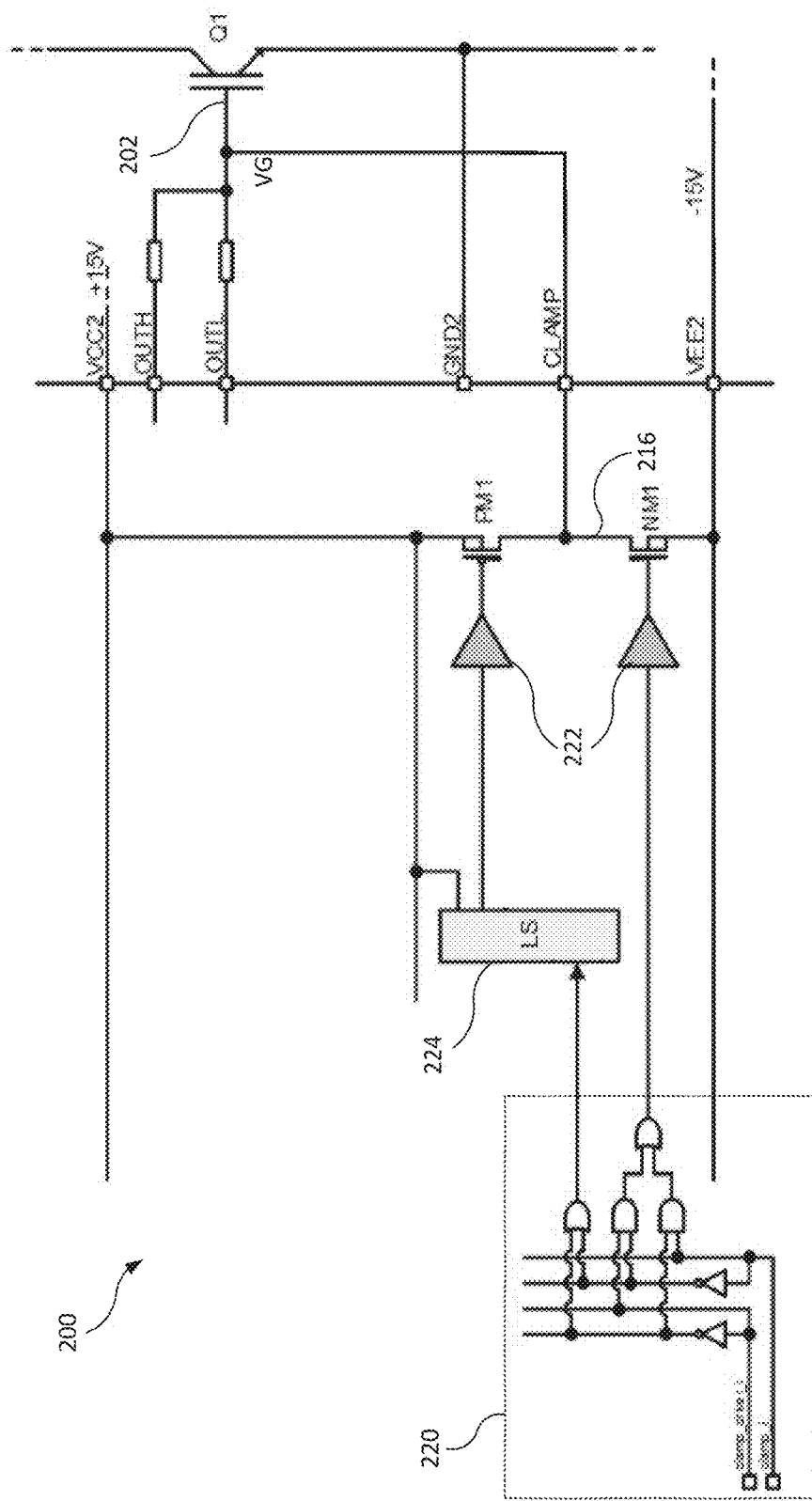

FIGS. 2A-2B show schematic circuit diagrams of a configurable clamp circuit 200 in accordance with an embodiment of the present invention. The configurable clamp circuit 200 may be a part of another circuit, such as a driver circuit like driver circuit 102 shown in FIG. 1. The configurable clamp circuit 200 includes a first driver transistor NM1 and a second driver transistor PM1. In some embodiments the function of the second driver transistor PM1 may be implemented by a pull-up circuit using an n-channel MOSFET or a combination of n-channel and p-channel MOSFETs. Both NM1 and PM1 are coupled to a CLAMP pin that is coupled to the gate node 202 of a power device Q1. In the embodiments shown in FIGS. 2A-2B, Q1 is shown as an IGBT, though in other embodiments Q1 may be a different type of power device as described previously. According to one embodiment, the configurable clamp circuit 200 is operated in one of two clamping configurations. In the first configuration, shown in FIG. 2A, the external clamp transistor T1 is present and is used as a clamp transistor to shunt parasitic current from the gate of Q1. In the second configuration, shown in FIG. 2B, the external clamp transistor T1 is not present and the driver transistor NM1 is used as a clamp transistor to shunt parasitic current from the gate of Q1. Each configuration is described in greater detail below.

In the embodiment shown in FIG. 2A, the voltage $V_G$ at the gate node 202 of Q1 is driven through the OUTH and OUTL pins. The OUTH and OUTL pins may be part of the configurable clamp circuit 200 or part of a separate gate driver circuit. To turn on Q1, the OUTH pin injects current to the gate node 202, raising the voltage $V_G$ above Q1's threshold voltage. To turn off Q1, the OUTL pin sinks current from the gate node 202, lowering the voltage $V_G$ below Q1's threshold voltage. In some cases, the voltage $V_G$ at the gate node 202 is monitored whenever Q1 is nominally turned off. When the voltage $V_G$ drops below a predetermined clamping voltage, the configurable clamp circuit 200 activates a clamp transistor T1 that provides a low impedance path in parallel to OUTL and shunts current away from the gate node 202. In some cases, the clamp transistor T1 is activated when Q1 is nominally turned off without monitoring voltage $V_G$. In this manner, in the event of parasitic turn-on, parasitic current is dissipated effectively from the gate node 202, thereby eliminating or reducing the severity of the parasitic turn-on. The clamp transistor T1 may remain activated until Q1 is turned on again. In some cases, this may be referred to as an "Active Miller Clamp" circuit, in which an additional low-side output of the driver bypasses $R_G$ to reduce the resistance between the gate terminal 202 and a current sink (typically a voltage reference node). For example, the clamp transistor may shunt the current to GND2 for a unipolar device implementation, to VEE2 for a bipolar device implementation, or to another node in another implementation. The voltage $V_G$ at the gate node 202 may be monitored, for example, by a comparator circuit or other circuit (not shown) coupled to the configurable clamp circuit 200. The voltage $V_G$ may be monitored, for example, through the OUTH pin, the CLAMP pin, or through another pin or at another node. The clamping voltage value of $V_G$ may be configured to be a voltage lower than the threshold voltage of Q1. For example, in some embodiments the clamping voltage value may be a voltage relative to GND2, such as GND2+2V, GND2+3V, or another voltage difference relative to GND2 or another voltage such as VEE2. In other embodiments the clamping voltage value may be a fixed reference voltage or a voltage difference relative to another voltage, node, or pin.

In the first configuration of the embodiment, the gate terminal 210 of the external clamp transistor T1 is coupled the driver transistors NM1 and PM1 through the CLAMP pin. The source terminal 212 of T1 is coupled to voltage reference VEE2, though in other embodiments the source terminal 212 may be coupled to a different voltage reference or node, such as GND or another voltage reference. The drain terminal 214 of T1 is coupled to the gate terminal 202 of Q1. Thus, the driver transistors NM1 and PM1 can operate to turn on T1 and provide a low-ohmic path through T1 that shunts a parasitic current through T1 to VEE2. In some embodiments, the external clamp transistor T1 may be a p-type or p-channel MOSFET, an n-type or n-channel MOSFET, another type of transistor, or a circuit including multiple transistors. In some embodiments, the external clamp transistor T1 is a low voltage transistor in which a VGS has a maximum voltage of about 15 to about 20 V.

In the second configuration, shown in FIG. 2B, the external clamp transistor T1 is not present and the drain terminal 216 of NM1 is directly coupled to the gate terminal 202 of Q1 through the CLAMP pin. In the second configuration, the transistors NM1 and PM1 are not used as driver transistors. Specifically, PM1 is disabled and only NM1 is used. Thus, for example, the configurable clamp circuit 200 can operate to turn on transistor NM1 and shunt a parasitic current through NM1 to VEE2.

The configuration of the configurable clamp circuit 200 (i.e., whether it is in the first configuration shown in FIG. 2A or in the second configuration shown in FIG. 2B) may be controlled by one or more control signals. The control signals can, for example, be provided from other circuits or logic within an integrated circuit. As an example, in FIGS. 2A-2B, the control signal clamp_driver_i can be a logic signal voltage, such as a high voltage (such as 1V, 3.3V, 5V or another voltage) or a low voltage (such as 0V). In the embodiment shown in FIGS. 2A-2B, a high voltage on clamp_driver_i can signal that the configurable clamp circuit 200 is being operated in the first configuration (i.e., as a driver for an external clamp transistor). Similarly, a low voltage on clamp_driver_i can signal that the configurable clamp circuit 200 is being operated in the second configuration (i.e., as a clamp transistor). In some cases, a control signal value corresponding to the configurable clamp circuit 200 configuration may be stored in a memory register.

In some cases, the operation of the clamp transistor (that is, T1 in the first configuration example of FIG. 2A or NM1 in the second configuration example of FIG. 2B) is also controlled by a control signal. For example, in an embodiment a high voltage on clamp_i turns on the clamp transistor to shunt the excess current away from the gate terminal 202 of Q1. On the other hand, a low voltage on clamp_i turns off the clamp transistor.

In some embodiments, the control signals may be coupled to NM1 and PM1 through logic, such as example logic subcircuit 220 in FIGS. 2A-2B. Logic subcircuit 220 is coupled to other circuits or logic of the integrated circuit and couples clamp_driver_i and clamp_i to NM1 and PM1. The logic subcircuit 220 turns NM1 and P1\41 on and off appropriately depending on the configuration (as indicated by clamp_driver_i) and whether the clamp is desired to be turned on (as indicated by clamp_i). In some cases, additional logic may be implemented, such as additional inverters 222 which can be used to maintain the proper logical meaning of clamp_i in the first configuration. In some cases, other circuitry may be coupled between the control signals and the driver transistors. For example, as shown in FIGS. 2A-2B, a level shifter 224 is implemented between logic subcircuit 220 and the gate terminal of PM1 to adjust the voltage of the control signal appropriately. The logic subcircuit 220 is but one example, other logic subcircuits or circuit configurations may be used in other embodiments.

Figure 3A:
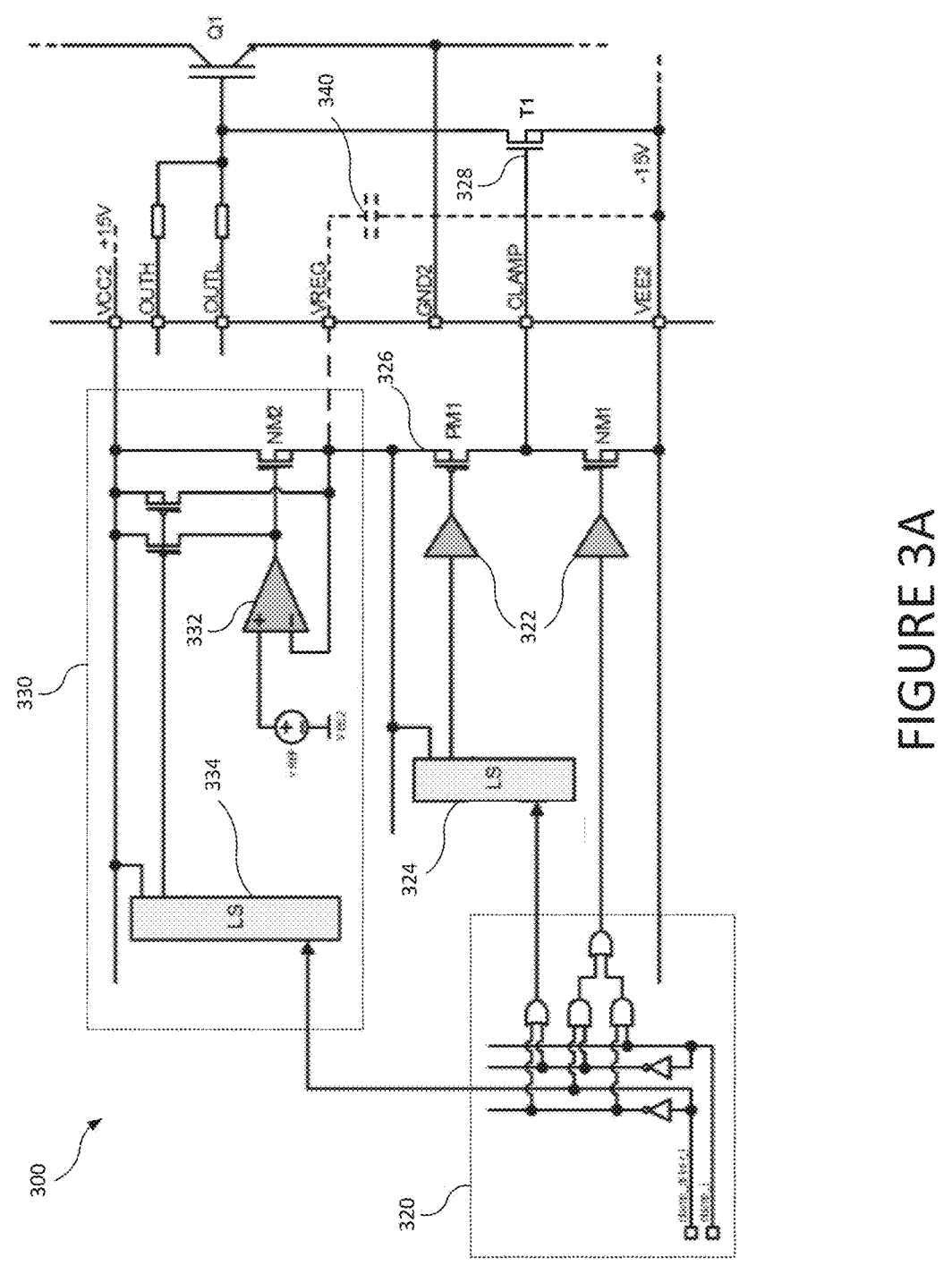
Figure 3B:
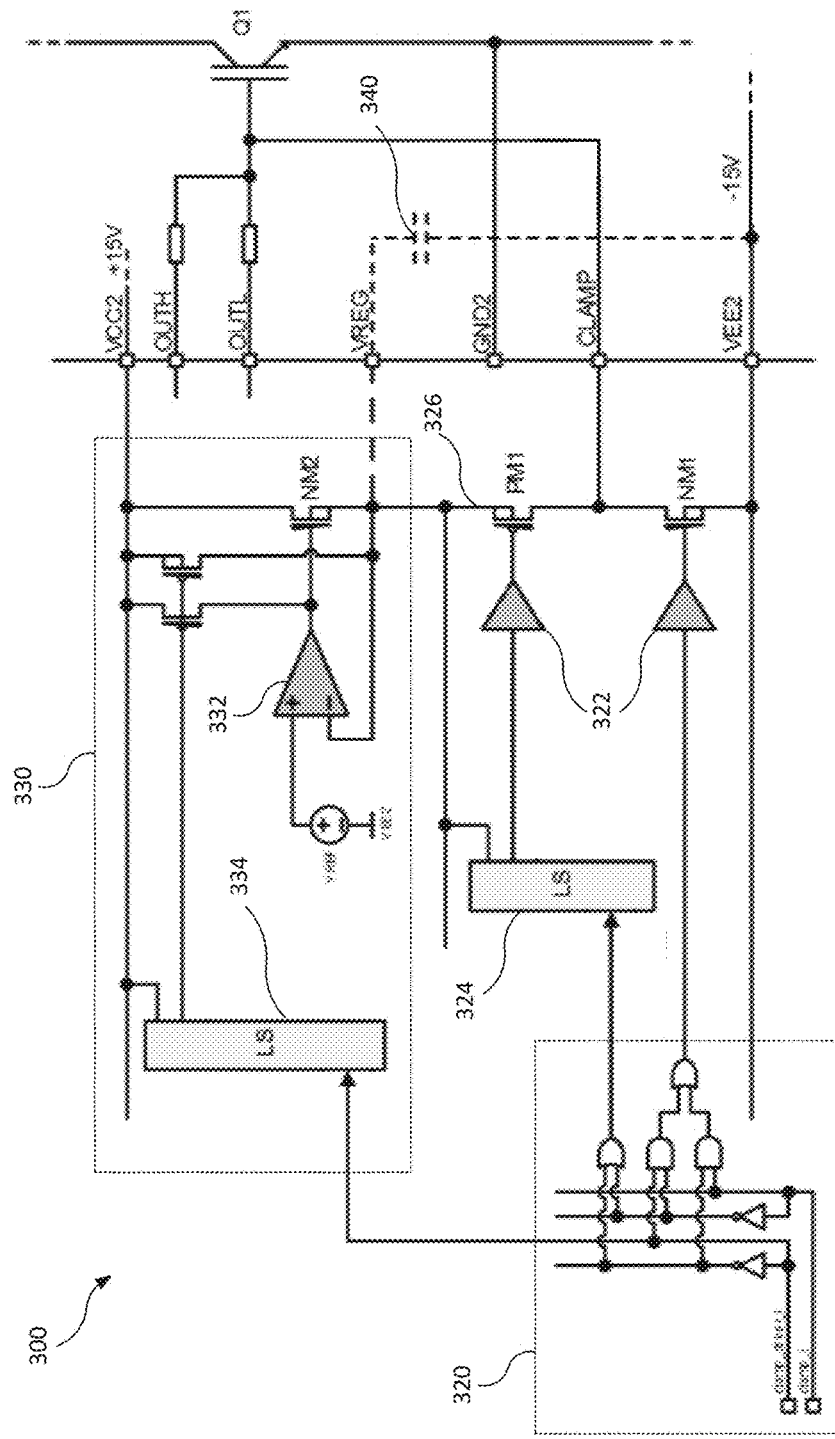
Figure 4A:
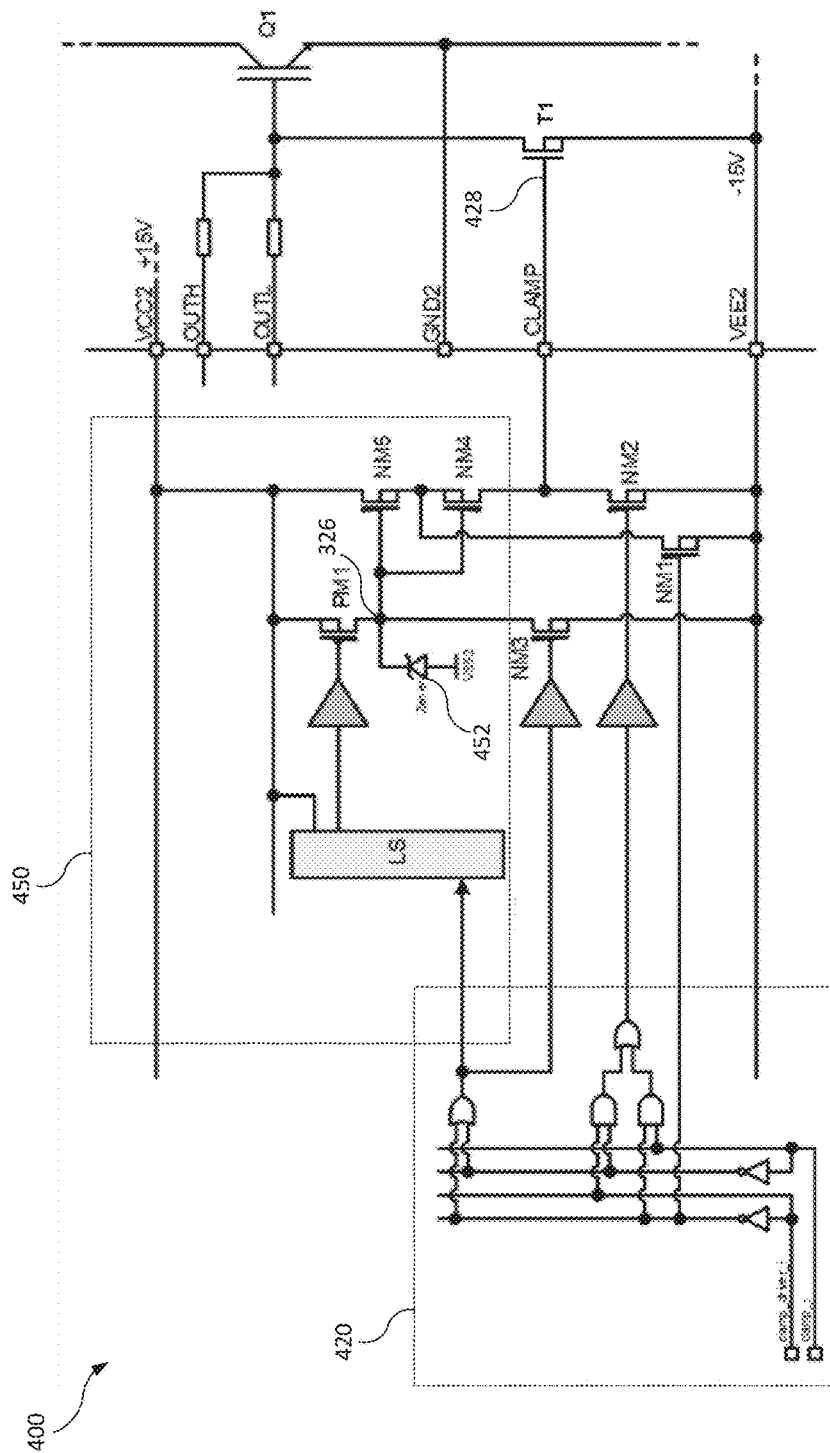
FIGS. 4A-4B illustrate embodiments of a gate-driver circuit having a configurable clamp with a voltage limitation subcircuit.
Figure 4B:
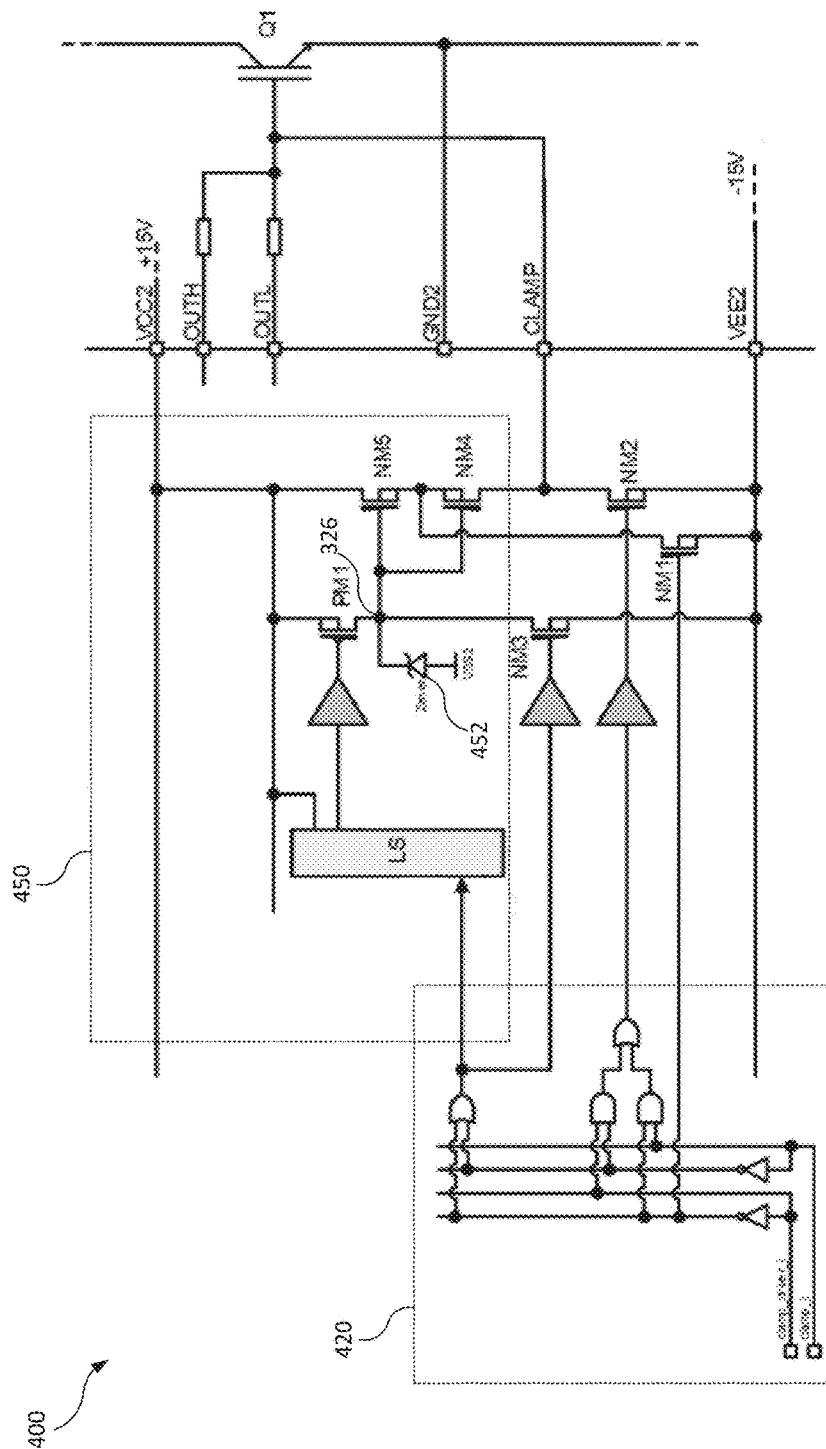

In some cases when the configurable clamp circuit 200 is in the first configuration, voltage limitation may be desired in order to limit the voltage on the gate terminal 210 of the external clamp transistor T1 to reduce the chance of high-voltage damage to T1 during a turn-on of T1. FIGS. 3A-3B show schematic circuit diagrams of an embodiment incorporating a voltage regulator circuit 330 to limit the voltage at the gate terminal 210, and FIGS. 4A-4B show schematic circuit diagrams of an embodiment incorporating a voltage limiter circuit 450 to limit the voltage at the gate terminal 210. The embodiments shown in FIGS. 3A-3B and FIGS. 4A-4B are examples; other configurable clamp circuits can have other implementations or configurations to regulate or limit the gate voltage of T1.

The embodiment of the configurable clamp circuit 300 shown in FIGS. 3A-3B is similar to the configurable clamp circuit 200 of FIGS. 2A-2B, except that the configurable clamp circuit 300 shown in FIGS. 3A-3B includes an example voltage regulation subcircuit 330 between the external power supply VCC2 and the driver transistors PM1 and NM1. A level shifter 334 within the voltage regulation subcircuit 330 is coupled to clamp_driver_i through the logic subcircuit 320. FIG. 3A shows the configurable clamp circuit 300 in the first configuration, and FIG. 3B shows the configurable clamp circuit 300 in the second configuration. The voltage regulation subcircuit 330 is configured to maintain a voltage of VREF at the source terminal 326 of PM1. Thus, as external clamp transistor T1 is driven by PM1 and NM1, the maximum voltage at the gate terminal 328 of T1 is limited to VREF even during a turn-on of T1. When the configurable clamp circuit 300 is in the second configuration, shown in FIG. 3B, the voltage regulation subcircuit 330 is disabled, the source terminal 326 of PM1 is pulled to VCC2, and thus PM1 is disabled. Otherwise, the operation is substantially the same as the non-voltage limited version shown in FIG. 2B. In some cases, a VREG pin may be coupled to the source terminal 326, and an external decoupling capacitor 340 may couple the VREG pin to VEE2 or to another reference voltage. In the example voltage regulation subcircuit 330 shown in FIGS. 3A-3B, an NMOS is used as a pass element, though in other embodiments a PMOS may be used as a pass element. The voltage regulation subcircuit 330 is but one example, other voltage regulation subcircuits or circuit configurations may be used in other embodiments.

The embodiment of the configurable clamp circuit 400 shown in FIGS. 4A-4B is similar to the configurable clamp circuit 200 of FIGS. 2A-2B, except that the configurable clamp circuit 400 shown in FIGS. 4A-4B includes an example voltage limiter subcircuit 450. FIG. 4A shows the configurable clamp circuit 400 in the first configuration, and FIG. 4B shows the configurable clamp circuit 400 in the second configuration. The voltage limiter subcircuit 450 includes a source follower pull-up stage implemented by transistor NM5 and coupled to the driver transistor PM1. In some embodiments, an optional transistor NM4 can be coupled in series to NM5 to implement a back-to-back switch for disabling the high-side driver. The voltage limitation in the voltage limiter subcircuit 450 is implemented by Zener diode 452. Zener diode 452 is coupled to the drain terminal 326 of driver transistor PM1 and to a reference voltage such as VSS2 or another reference voltage. The Zener diode 452 can have a specified Zener voltage, such as 8V, 10V, 12V or another voltage. The drain terminal 326 of transistor PM1 will be limited to the Zener voltage of Zener diode 452 relative to the Zener diode's reference voltage, and thus the gate terminal 428 of T1 will also be voltage limited. The voltage limiter subcircuit 450 is but one example, other voltage limiter subcircuits or circuit configurations may be used in other embodiments. In some embodiments, the voltage limiting function of the Zener diode 452 is instead implemented by a voltage clamping circuit with a defined clamp voltage.

Advantages of embodiments include enabling a single driver to be suitable for smaller and larger power levels and different applications. Moreover, the configurable clamp circuit can provide a low inductive clamp connection between the driver and the driven power device or between the external clamp transistor and the driven power device. In some embodiments, an external clamp transistor can have a higher current handling capability than an integrated clamp transistor. In some cases, an external clamp transistor can have a higher gate voltage limitation than an integrated clamp transistor.

A further advantage is the use of an external clamp transistor rather than an internal clamp transistor can reduce the inductance of the connection through the clamp transistor between the voltage reference and the gate terminal of the power device. To achieve an improved clamping, the circuit layout can be optimized for low inductance routing between the gate terminal of the power device and the CLAMP pin. As described previously, connection inductance can increase the likelihood or severity of a parasitic current event. A longer connection path between the power device and the clamp transistor can have a larger inductance. Thus, the use of an external clamp transistor reduces the connection path length and can reduce the inductance, thereby improving the clamp circuit's response to a parasitic current event. In some cases, the driver circuit must be placed away from the power device due to, for example, layout limitations or other issues. By using an external clamp transistor placed close to the power device, a low inductive connection may be made between the clamp transistor and the power device while the driver circuit with the configurable clamp circuit still can be placed relatively far away from the power device. This can allow greater design flexibility.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a clamp driver circuit comprising a pull-up circuit coupled between a first power supply terminal and an output terminal of the clamp driver circuit, and a pull-down circuit coupled between a second power supply terminal and the output terminal of the clamp driver circuit;
    a voltage regulator coupled between the first power supply terminal and the pull-up circuit; and
    a logic circuit coupled to the pull-up circuit and the pull-down circuit, the logic circuit comprising a clamp driver configuration input and a clamp driver input, wherein the logic circuit is configured to:
        operate the pull-up circuit and the pull-down circuit according to a first polarity when the clamp driver configuration input is in a first state, and
        operate the pull-up circuit and the pull-down circuit according to a second polarity opposite the first polarity and deactivate the voltage regulator when the clamp driver configuration input is in a second state different from the first state.

2. The circuit of claim 1, further comprising a power transistor having a control node coupled to the output terminal of the clamp driver circuit.

3. The circuit of claim 2, wherein the control node of the power transistor is directly connected to the output terminal of the clamp driver circuit.

4. The circuit of claim 2, further comprising an external clamp transistor coupled between the control node of the power transistor and the output terminal of the clamp driver circuit.

5. The circuit of claim 2, further comprising an external clamp circuit, the external clamp circuit comprising an external transistor, wherein the control node of the external transistor is coupled to the output terminal of the clamp driver circuit and an output terminal of the external transistor is coupled to the control node of the power transistor.

6. The circuit of claim 2, wherein the power transistor is external to the clamp driver circuit.

7. The circuit of claim 2, wherein the power transistor is an IGBT.

8. The circuit of claim 2, wherein the clamp driver circuit is configured to dissipate current from the control node of the power transistor.

9. The circuit of claim 1, wherein the clamp driver circuit is disposed on a semiconductor substrate.

10. The circuit of claim 1, wherein the pull-up circuit comprises a p-channel MOSFET and the pull-down circuit comprises an n-channel MOSFET.

11. The circuit of claim 1, further comprising a voltage limiter circuit coupled between the first power supply terminal and the pull-up circuit of the clamp driver circuit.

12. The circuit of claim 11, wherein the voltage limiter circuit comprises a Zener diode.

13. The circuit of claim 1, further comprising a controller coupled to the clamp driver circuit, wherein the controller is configured to send a first control signal to the clamp driver circuit to control whether the clamp driver circuit is configured to operate according to the first polarity or according to the second polarity.

14. The circuit of claim 1, further comprising a voltage limiting circuit coupled to the clamp driver circuit and configured to limit the voltage at the output terminal of the clamp driver circuit.

15. The circuit of claim 14, wherein the voltage limiting circuit comprises a Zener diode.

16. A method of operating a configurable clamp driver circuit, the method comprising:
    configuring the clamp driver circuit, comprising
        receiving a control signal;
        configuring a selectable polarity of a clamping signal output by the clamp driver circuit at an output terminal based on the received control signal;
        configuring the clamp driver circuit by coupling the output terminal of the clamp driver circuit to a gate terminal of an external clamp transistor, wherein an output terminal of the external clamp transistor is coupled to the gate terminal of a first transistor;
    switching off the first transistor; and
    activating the clamp driver circuit according to the configured selectable polarity; and
    deactivating a voltage regulator coupled between a power supply terminal and an output stage of the clamp driver circuit.

17. The method of claim 16, further comprising limiting a voltage at the output terminal of the clamp driver circuit.

18. The method of claim 16, wherein activating the clamp driver circuit comprises providing a low-resistance path from the gate terminal of the first transistor to a voltage supply.

19. A method of operating a clamp driver circuit comprising a pull-up circuit coupled between a first power supply terminal and an output terminal of the clamp driver circuit, and a pull-down circuit coupled between a second power supply terminal and the output terminal of the clamp driver circuit; a voltage regulator coupled between the first power supply terminal and the pull-up circuit; and a logic circuit coupled to the pull-up circuit and the pull-down circuit, the logic circuit comprising a clamp driver configuration input and a clamp driver input, the method comprising:

using the logic circuit, operating the pull-up circuit and the pull-down circuit according to a first polarity when the clamp driver configuration input is in a first state; and using the logic circuit, operating the pull-up circuit and the pull-down circuit according to a second polarity opposite the first polarity and deactivate the voltage regulator when the clamp driver configuration input is in a second state different from the first state.

* * * * *